US012132422B2

(12) United States Patent
Pathak

(10) Patent No.: US 12,132,422 B2
(45) Date of Patent: Oct. 29, 2024

(54) ELECTRICAL POWER SYSTEM FOR A RESOURCE EXTRACTION SYSTEM

(71) Applicant: OneSubsea IP UK Limited, London (GB)

(72) Inventor: Parth Dilip Pathak, Cypress, TX (US)

(73) Assignee: OneSubsea IP UK Limited, London (GB)

( * ) Notice: Subject to any disclaimer, the term of this patent is extended or adjusted under 35 U.S.C. 154(b) by 0 days.

(21) Appl. No.: 18/255,638

(22) PCT Filed: Dec. 2, 2021

(86) PCT No.: PCT/US2021/061529
§ 371 (c)(1),
(2) Date: Jun. 2, 2023

(87) PCT Pub. No.: WO2022/120003
PCT Pub. Date: Jun. 9, 2022

(65) Prior Publication Data
US 2024/0007024 A1 Jan. 4, 2024

Related U.S. Application Data

(60) Provisional application No. 63/120,310, filed on Dec. 2, 2020.

(51) Int. Cl.
*H02N 99/00* (2006.01)
*H02J 7/00* (2006.01)

(52) U.S. Cl.
CPC ........... *H02N 99/00* (2013.01); *H02J 7/0013* (2013.01)

(58) Field of Classification Search
CPC ............................. H02N 99/00; H02J 7/0013
See application file for complete search history.

(56) References Cited

U.S. PATENT DOCUMENTS 6,150,601 A    11/2000  Schnatzmeyer et al.
6,380,476 B1 *  4/2002  Heijnen .............. E21B 41/0085
                                                    166/65.1
(Continued)

FOREIGN PATENT DOCUMENTS

GB        2433752 A1    7/2007

OTHER PUBLICATIONS

Search Report and Written Opinion of International Patent Application No. PCT/US2021/061529 dated Apr. 1, 2022, 11 pages.
(Continued)

*Primary Examiner* — Carlos Amaya
(74) *Attorney, Agent, or Firm* — Jeffrey D. Frantz

(57) ABSTRACT

An electrical power system for a resource extraction system includes a thermoelectric generator assembly configured to couple to a wall of a fluid containment structure. A portion of the thermoelectric generator assembly is configured to be disposed within an opening in the wall that extends through the wall to a cavity within the fluid containment structure. In addition, the thermoelectric generator assembly includes a thermoelectric generator configured to be in thermal communication with a fluid within the opening and with an environment external to the fluid containment structure. The thermoelectric generator is configured to generate electrical power in response to a temperature differential between the fluid within the opening and the environment.

20 Claims, 5 Drawing Sheets

(56) References Cited

U.S. PATENT DOCUMENTS

| | | | |
|---|---|---|---|
| 10,128,427 | B2 | 11/2018 | Ellison |
| 10,408,019 | B2 * | 9/2019 | Yeo .................... H10N 10/854 |
| 2007/0151591 | A1 | 7/2007 | Jeffryes |
| 2010/0236773 | A1 | 9/2010 | Carson et al. |
| 2012/0000663 | A1 | 1/2012 | Mebarkia et al. |
| 2013/0340801 | A1 | 12/2013 | Zhang et al. |
| 2014/0352749 | A1 * | 12/2014 | Strei .................... H10N 10/13 |
| | | | 136/201 |
| 2015/0107824 | A1 * | 4/2015 | Signorelli .......... E21B 41/0085 |
| | | | 166/244.1 |
| 2015/0159481 | A1 | 6/2015 | Mebarkia et al. |
| 2017/0005252 | A1 | 1/2017 | Moczygemba |
| 2018/0313192 | A1 | 11/2018 | Frosell et al. |

OTHER PUBLICATIONS

International Preliminary Report on Patentability of International Patent Application No. PCT/US2021/061529 dated Jun. 15, 2023, 8 pages.

Extended Search Report issued in European Patent Appl. No. 21901434.7 on Sep. 17, 2024; 7 pages.

* cited by examiner

ELECTRICAL POWER SYSTEM FOR A RESOURCE EXTRACTION SYSTEM

CROSS REFERENCE TO RELATED APPLICATION

This application is the National Stage Entry of International Application No. PCT/US2021/061529, filed Dec. 2, 2021, which claims priority from and the benefit of U.S. Provisional Application No. 63/120,310, entitled "Thermo-Electric Generator for Subsea Equipment," filed Dec. 2, 2020, which is hereby incorporated by reference in its entirety.

BACKGROUND

The present disclosure relates generally to an electrical power system for a resource extraction system.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

Fluids (e.g., hydrocarbons) may be extracted from subsurface reservoirs and transported to the surface for commercial sales, such as for use in the power industry, transportation industry, manufacturing industry, and other applicable industries. For example, a well may be drilled into the ground to a subsurface reservoir, and equipment may be installed in the well and on the surface to facilitate extraction of the fluids. In some cases, the wells may be offshore (e.g., subsea), and the equipment may be disposed underwater, on offshore platforms, on floating systems, or a combination thereof.

Certain components of the subsea equipment include electrical devices that receive electrical power from a surface electrical supply system or a subsea power unit. For example, certain valves (e.g., of a tree, of a manifold, of a blowout preventer, etc.) include an electric actuator configured to control the position of the valve. In addition, one or more controllers (e.g., configured to control the positions of the valves) may receive electrical power from the surface electrical supply system/subsea power unit. The electrical devices may be electrically coupled to a central subsea battery system having multiple redundant batteries. The central battery system may receive electrical power from the surface electrical supply system/subsea power unit and provide electrical power to the subsea electrical devices. Alternatively, a smaller battery may be disposed at each respective subsea electrical device, and each smaller battery may receive electrical power from the surface electrical supply system/subsea power unit and provide electrical power to the respective subsea electrical device.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In certain embodiments, an electrical power system for a resource extraction system includes a thermoelectric generator assembly configured to couple to a wall of a fluid containment structure. A portion of the thermoelectric generator assembly is configured to be disposed within an opening in the wall that extends through the wall to a cavity within the fluid containment structure. In addition, the thermoelectric generator assembly includes a thermoelectric generator configured to be in thermal communication with a fluid within the opening and with an environment external to the fluid containment structure. The thermoelectric generator is configured to generate electrical power in response to a temperature differential between the fluid within the opening and the environment.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Specific embodiments of the present disclosure are described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time-consuming, but would nevertheless be a routine undertaking of design, fabrication, and manufacture for those of ordinary skill having the benefit of this disclosure.

When introducing elements of various embodiments, the articles "a," "an," "the," and "said" are intended to mean that there are one or more of the elements. The terms "comprising," "including," and "having" are intended to be inclusive and mean that there may be additional elements other than the listed elements. Moreover, any use of "top," "bottom," "above," "below," other directional terms, and variations of these terms is made for convenience, but does not require any particular orientation of the components.

Figure 1:
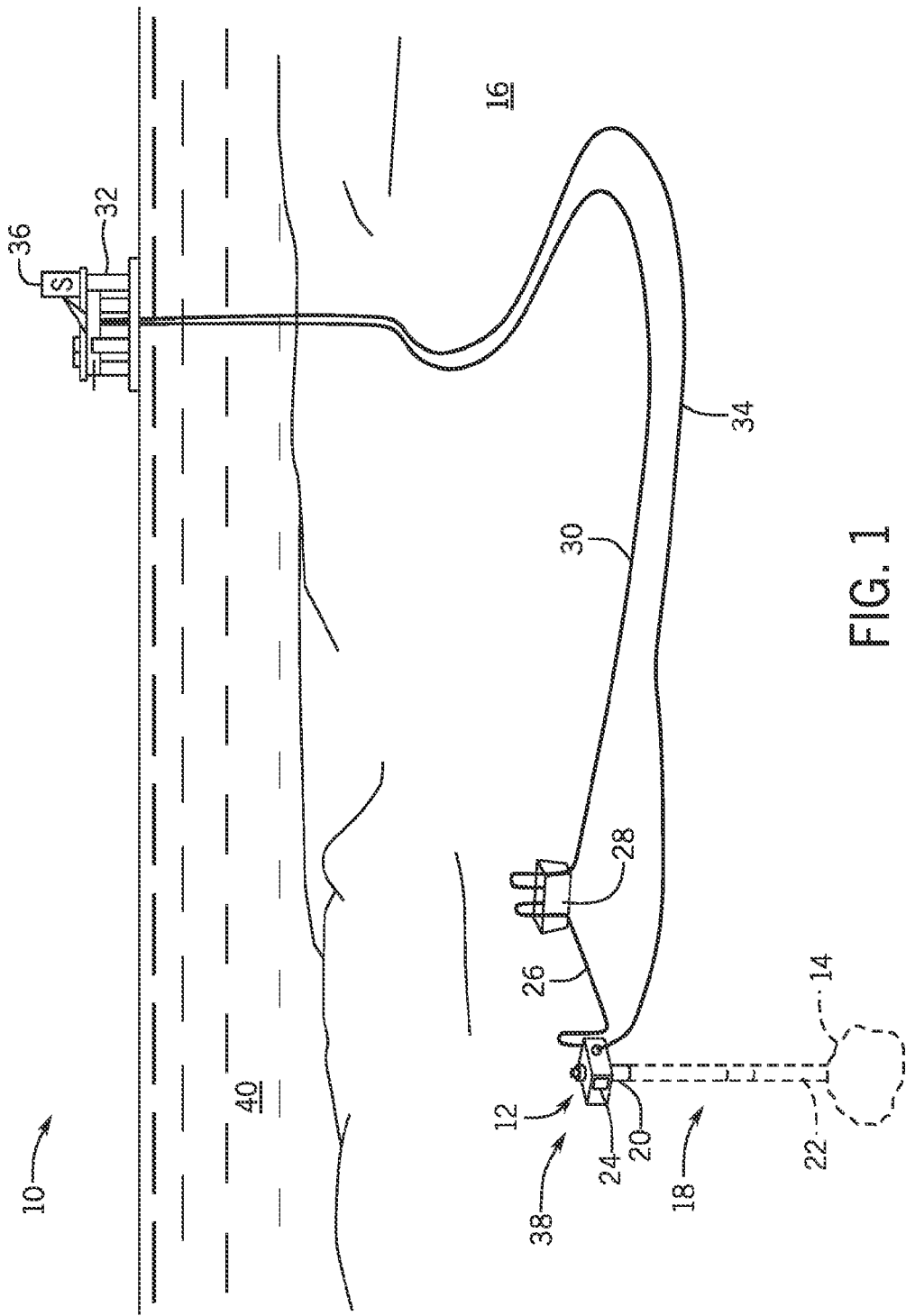
FIG. 1 is a schematic diagram of an embodiment of a resource extraction system.

FIG. 1 is a schematic diagram of an embodiment of a resource extraction system 10. The resource extraction system 10 may be configured to extract various minerals and natural resources, including hydrocarbon fluid (e.g., oil and/or natural gas), from the earth, and/or the resource extraction system may be configured to inject substances into the earth. In the illustrated embodiment, the resource extraction system 10 is subsea system. As illustrated, the resource extraction system 10 includes a wellhead 12 coupled to a mineral deposit 14, which is located beneath the seafloor 16, via a well 18. The well 18 includes a wellhead hub 20 and a well-bore 22. The wellhead hub 20 may include a large diameter hub that is disposed at the termination of the well-bore 22. The wellhead hub 20 provides for the connection of the wellhead 12 to the well 18.

Furthermore, the wellhead 12 includes a tree 24 configured to receive hydrocarbon fluid from the mineral deposit 14 via the wellbore 22. After passing through the tree 24, the hydrocarbon fluid flows through jumper(s) 26 to a pipeline end termination and/or a pipeline end manifold 28. The pipeline end manifold 28 connects to one or more flowlines 30, and the flowline(s) 30 facilitate flow of the hydrocarbon fluid to a surface facility, such as the illustrated platform 32. In some embodiments, the flowline(s) 30 may extend from the pipeline end manifold 28 to another surface facility, such as a floating production, storage, and offloading unit (FPSO), or a shore-based facility. In addition, the mineral extraction system 10 includes line(s) and/or conduit(s) 34 configured to supply fluid and electrical power to the subsea equipment. The line(s)/conduit(s) 34 may also include data lines configured to establish a communication link between the surface facility and the subsea equipment.

In certain embodiments, the line(s)/conduit(s) 34 are configured to transfer electrical power from a surface electrical supply system 36 to multiple electrical devices within the subsea equipment. Additionally, or alternatively, electrical power may be provided to the electrical devices within the subsea equipment by a subsea power unit. The subsea equipment may include the tree 24, the pipeline end manifold 28, a blowout preventer (BOP), a valve, a choke, other suitable equipment, or a combination thereof. In addition, the electrical devices may include valve actuator(s), choke actuator(s), locking mechanism actuator(s), sensor(s) (e.g., pressure sensor(s), temperature sensor(s), etc.), controller(s), other suitable device(s), or a combination thereof. As discussed in detail below, the resource extraction system 10 includes an electrical power system 38 positioned at the subsea equipment and configured to generate electrical power independently of the surface electrical supply system/subsea power unit. As a result, the electrical power system 38 may provide locally generated electrical power to one or more of the electrical devices of the subsea equipment.

In certain embodiments, the electrical power system 38 includes a battery configured to be positioned at a subsea component (e.g., the tree 24, the pipeline end manifold 28, the BOP, a valve, etc.) of the resource extraction system 10. The subsea component is positioned subsea (e.g., within the water 40) and configured to house a fluid (e.g., a hydrocarbon fluid, such as oil and/or natural gas, etc.). The battery is configured to be electrically coupled to an electrical device (e.g., valve actuator, locking mechanism actuator, sensor, controller, etc.) of the subsea component. In addition, the battery is configured to provide electrical power to the electrical device at least while electrical power from a remote electrical supply system (e.g., including the surface electrical supply system 36 or the subsea power unit) is interrupted. For example, in certain embodiments, the battery may receive electrical power from the remote electrical supply system and provide continuous electrical power to the electrical device. Furthermore, in certain embodiments, the battery may provide electrical power to the electrical device in response to interruption of electrical power from the remote electrical supply system to the electrical device.

The electrical power system 38 also includes a thermoelectric generator configured to couple to the subsea component. The thermoelectric generator is electrically coupled to the battery, and the thermoelectric generator is configured to generate electrical power in response to a temperature differential between the fluid within the subsea component and the water and to provide the electrical power to the battery. Because the thermoelectric generator provides electrical power to the battery, the battery may have sufficient capacity to provide the electrical device with electrical power (e.g., sufficient electrical power for shutdown operations) in response to interruption of the electrical power provided by the remote electrical supply system.

Furthermore, in certain embodiments, the electrical power system 38 includes a thermoelectric generator assembly configured to couple to a wall of a fluid containment structure (e.g., a pipe, a conduit, a flowline, a jumper, a subsea component, such as the tree 24, the pipeline end manifold 28, the BOP, a valve, etc.). A portion of the thermoelectric generator assembly is configured to be disposed within an opening in the wall, in which the opening extends through the wall to a cavity within the fluid containment structure. In addition, the thermoelectric generator assembly includes a thermoelectric generator configured to be in thermal communication with a fluid (e.g., oil and/or natural gas) within the opening and with an environment external to the fluid containment structure (e.g., the water 40, etc.). The thermoelectric generator is configured to generate electrical power in response to a temperature differential between the fluid within the opening and the environment. Because the thermoelectric generator is in thermal communication with the fluid within the opening, the temperature differential across the thermoelectric generator may be significantly greater than the temperature differential across a thermoelectric generator positioned on an outer surface of the fluid containment structure, thereby substantially increasing electrical power output by the thermoelectric generator.

Figure 2:
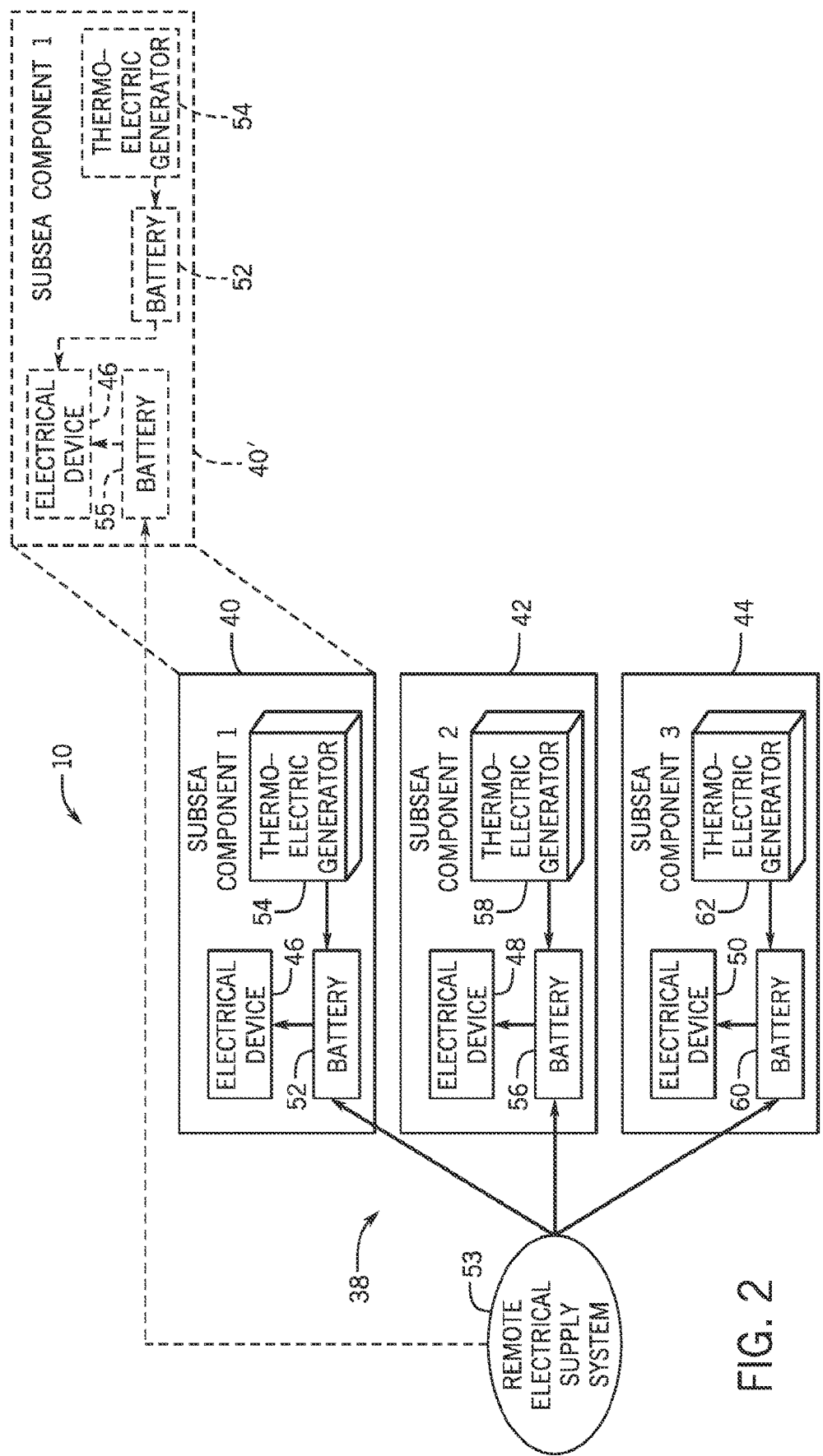
FIG. 2 is a block diagram of an embodiment of an electrical power system that may be employed within the resource extraction system of FIG. 1.

FIG. 2 is a block diagram of an embodiment of an electrical power system 38 that may be employed within the resource extraction system 10 of FIG. 1. In the illustrated embodiment, the resource extraction system 10 includes a first subsea component 40, a second subsea component 42, and a third subsea component 44. Each subsea component is disposed within water (e.g., subsea) and is configured to house a fluid (e.g., hydrocarbon fluid, such as oil and/or natural gas, etc.). Furthermore, each subsea component may correspond to any suitable component of the resource extraction system 10, such as a tree, a BOP, a pipeline end manifold, a valve, or another suitable component. In certain embodiments, each subsea component includes a main structure (e.g., body, housing, etc.) and one or more conduits (e.g., pipes, lines, etc.) fluidly coupled to the main structure. Each conduit may be configured to provide fluid (e.g., hydrocarbon fluid, such as oil and/or natural gas, etc.) to the main structure and/or to receive fluid from the main structure. While the resource extraction system 10 includes three subsea components in the illustrated embodiment, in other embodiments, the resource extraction system may include more or fewer subsea components.

In the illustrated embodiment, the first subsea component 40 includes a first electrical device 46, the second subsea component 42 includes a second electrical device 48, and the third subsea component 44 includes a third electrical device 50. While each subsea component includes a single electrical device in the illustrated embodiment, in other embodiments, at least one subsea component may include multiple electrical devices (e.g., 2, 3, 4, 5, 6, 7, 8, or more). Furthermore, each electrical device may include any suitable type of device configured to receive electrical power, such as a valve actuator, a locking mechanism actuator, a sensor, a controller, or any other suitable type of electrical device. For example, at least one subsea component may include a valve, and the electrical device may correspond to an electrical valve actuator (e.g., electric motor, electric solenoid, electric linear actuator, etc.) configured to directly control the position of the valve. Furthermore, at least one subsea component may include a valve and a hydraulic valve actuator configured to directly control the position of the valve, and the electrical device may correspond to an electric valve actuator configured to control hydraulic fluid flow to/from the hydraulic valve actuator to control the position of the valve. In addition, at least one subsea component may include a locking mechanism configured to selectively couple an element to the subsea component, and the electrical device may correspond to an electric locking mechanism actuator configured to control engagement/disengagement of the locking mechanism. The electrical device may also correspond to a sensor configured to monitor a temperature, a pressure, a flow rate, a stress, a strain, a force, a moment, or another suitable property, in which the sensor is powered by electrical power. Furthermore, the electrical device may correspond to a controller configured to receive sensor signal(s) from one or more sensors and/or to output control signal(s) to one or more actuators, in which the controller is powered by electrical power.

In the illustrated embodiment, the electrical power system 38 includes a first battery 52 positioned at the first subsea component 40 of the resource extraction system 10 (e.g., as compared to a battery positioned remote from the first subsea component). For example, the first battery 52 may be disposed within an interior structure of the first subsea component 40, or the first battery 52 may be disposed within a housing coupled to the first subsea component 40. As illustrated, the first battery 52 is electrically coupled to the first electrical device 46. In embodiments in which the first subsea component includes multiple electrical devices, the first battery may be electrically coupled to one or more of the electrical devices (e.g., each electrical device of the first subsea component). The first battery 52 is configured to provide electrical power to the first electrical device 46 at least while electrical power from a remote electrical supply system 53 (e.g., including the surface electrical supply system or the subsea power unit) to the first electrical device 46 is interrupted. While a single battery is positioned at the first subsea component in the illustrated embodiment, in other embodiments, multiple batteries (e.g., 2, 3, 4, 5, 6, or more) may be positioned at the first subsea component and electrically coupled to one or more electrical devices of the first subsea component. For example, each electrical device of the first subsea component or each electrical device of a group of electrical devices of the first subsea component may be electrically coupled to a respective battery. Furthermore, in certain embodiments, multiple batteries may be electrically coupled to a single electrical device, and/or one battery may be electrically coupled to multiple electrical devices. As used herein with regard to the remote electrical supply system, "remote" refers to a location remote from the respective subsea component. For example, the remote electrical supply system may include the surface electrical supply system or the subsea power unit. Furthermore, in certain embodiments, the remote electrical supply system may include a central/main battery or group of batteries (e.g., positioned on the surface or subsea, such as at the subsea power unit). The central/main battery/group of batteries may provide electrical power to the electrical devices of the subsea components at least while electrical power from the surface electrical supply system or the subsea power unit is interrupted.

In the illustrated embodiment, the remote electrical supply system 53 is electrically coupled to the first battery 52, and the remote electrical supply system 53 is not electrically coupled directly to the first electrical device 46. Accordingly, the remote electrical supply system 53 provides electrical power to the first battery 52, which charges the first battery 52, and the first battery 52 provides continuous electrical power to the first electrical device 46. In response to interruption of the electrical power from the remote electrical supply system 53 to the first electrical device 46, the first battery 52 continues to provide electrical power to the first electrical device 46. In other embodiments, the remote electrical supply system may be electrically coupled to the first battery and independently electrically coupled to the first electrical device, or the remote electrical supply system may be electrically coupled to the first electrical device and not electrically coupled to the first battery. In such embodiments, during normal operation, the remote electrical supply system may provide electrical power to the first electrical device, and the first battery may not provide electrical power to the first electrical device. In response to interruption of the electrical power from the remote electrical supply system to the first electrical device, the first battery may provide electrical power to the first electrical device. For example, the electrical power system may include a switch that blocks electrical power from the first battery to the first electrical device while the remote electrical supply system is providing electrical power to the first device and that enables electrical power to flow from the first battery to the first electrical device while electrical power from the remote electrical supply system to the first electrical device is interrupted. As used herein, interruption of electrical power from the remote electrical supply system to a respective electrical device refers to an interruption in electrical power from the remote electrical supply system to the respective electrical device in embodiments in which the remote electrical supply system is electrically coupled (e.g., directly electrically coupled) to the respective electrical device, and to an interruption in electrical power from the remote electrical supply system to a respective battery positioned at the respective subsea component and electrically coupled to a respective electrical device of the respective subsea component in embodiments in which the remote electrical supply system is electrically coupled to the respective battery.

In the illustrated embodiment, the electrical power system 38 includes a first thermoelectric generator 54 coupled to the first subsea component 40. As previously discussed, each subsea component may include a main structure (e.g., body, housing, etc.) and one or more conduits (e.g., pipes, lines, etc.) fluidly coupled to the main structure. Each conduit may be configured to provide fluid (e.g., hydrocarbon fluid, such as oil and/or natural gas, etc.) to the main structure and/or to receive fluid from the main structure. Accordingly, the first thermoelectric generator 54 may be coupled to the main structure of the first subsea component 40 and/or to one or more conduits of the first subsea component 40. As illustrated, the first thermoelectric generator 54 is electrically coupled to the first battery 52, and the first thermoelectric generator is configured to generate electrical power in response to a temperature differential between the fluid within the first subsea component (e.g., within the main structure of the first subsea component and/or within one or more conduits of the first subsea component) and the water surrounding the first subsea component and to provide the electrical power to the first battery. While a single thermoelectric generator is coupled to the first subsea component in the illustrated embodiment, in other embodiments, multiple thermoelectric generators (e.g., 2, 3, 4, 5, 6, or more) may be coupled to the first subsea component and electrically coupled to one or more batteries positioned at the first subsea component. For example, in certain embodiments, multiple thermoelectric generators may be electrically coupled to a single battery, and/or one thermoelectric generator may be electrically coupled to multiple batteries.

Furthermore, in certain embodiments, the first thermoelectric generator 54 is electrically coupled to the first battery 52, and the remote electrical supply system is not electrically coupled to the first battery. In such embodiments, the remote electrical supply system may be electrically coupled to the first electrical device. During normal operation, the remote electrical supply system may provide electrical power to the first electrical device, and the first battery may not provide electrical power to the first electrical device. In response to interruption of the electrical power from the remote electrical supply system to the first electrical device, the first battery may provide electrical power to the first electrical device. For example, the electrical power system may include a switch that blocks electrical power from the first battery to the first electrical device while the remote electrical supply system is providing electrical power to the first device and that enables electrical power to flow from the first battery to the first electrical device while electrical power from the remote electrical supply system to the first electrical device is interrupted.

Furthermore, in certain embodiments, as illustrated by the first subsea component 40' shown in phantom lines, the first thermoelectric generator 54 is electrically coupled to the first battery 52, the first battery 52 is electrically coupled to the first electrical device 46, and the remote electrical supply system 53 is not electrically coupled to the first battery 52. In addition, the electrical power system includes another battery 55 positioned at the first subsea component 40'. The other battery 55 is electrically coupled to the first electrical device 46 and to the remote electrical supply system 53. In addition, in the illustrated embodiment, the other battery 55 is not electrically coupled to the first thermoelectric generator 54. However, in other embodiments, the other battery may be electrically coupled to the first thermoelectric generator. During normal operation, the remote electrical supply system 53 provides electrical power to the other battery 55, which charges the other battery 55, and the other battery 55 provides continuous electrical power to the first electrical device 46. In response to interruption of the electrical power from the remote electrical supply system 53 to the first electrical device 46, the other battery 55 may continue to provide electrical power to the first electrical device 46, and the first battery 52 may provide electrical power to the first electrical device 46. For example, the electrical power system may include a switch that blocks electrical power from the first battery to the first electrical device while the remote electrical supply system is providing electrical power to the other battery and that enables electrical power to flow from the first battery to the first electrical device while electrical power from the remote electrical supply system to the other battery is interrupted. By way of further example, the electrical power system may include a switch that blocks electrical power from the first battery to the first electrical device while the other battery is providing electrical power to the first electrical device and that enables electrical power to flow from the first battery to the first electrical device while electrical power from the other battery to the first electrical device is interrupted. Because the electrical power system includes a first battery that is charged by the thermoelectric generator and another battery that is charged by the remote electrical supply system, the first electrical device may have a dual/redundant battery backup for the first electrical device at the first subsea component.

In the illustrated embodiment, the electrical power system 38 includes a second battery 56 positioned at the second subsea component 42. The second battery 56 is electrically coupled to the second electrical device 48, and the second battery 56 is configured to provide electrical power to the second electrical device 48 at least while electrical power from the remote electrical supply system 53 to the second electrical device 48 is interrupted. In addition, the electrical power system 38 includes a second thermoelectric generator 58. The second thermoelectric generator 58 is electrically coupled to the second battery 56, and the second thermoelectric generator is configured to generate electrical power in response to a temperature differential between the fluid within the second subsea component and the water surrounding the second subsea component and to provide the electrical power to the second battery. Each of the features, details, and variations disclosed above with regard to the first battery (e.g., connection of the battery to the remote electrical supply system, number of batteries, etc.) and the first thermoelectric generator (e.g., location of the thermoelectric generator, number of thermoelectric generators, inclusion of another battery that is not electrically coupled to the thermoelectric generator, etc.) may apply to the second battery and the second thermoelectric generator, respectively.

Furthermore, in the illustrated embodiment, the electrical power system 38 includes a third battery 60 positioned at the third subsea component 44. The third battery 60 is electrically coupled to the third electrical device 50, and the third battery 60 is configured to provide electrical power to the third electrical device 50 at least while electrical power from the remote electrical supply system 53 to the third electrical device 50 is interrupted. In addition, the electrical power system 38 includes a third thermoelectric generator 62. The third thermoelectric generator 62 is electrically coupled to the third battery 60, and the third thermoelectric generator is configured to generate electrical power in response to a temperature differential between the fluid within the third subsea component and the water surrounding the third subsea component and to provide the electrical power to the third battery. Each of the features, details, and variations disclosed above with regard to the first battery (e.g., connection of the battery to the remote electrical supply system, number of batteries, etc.) and the first thermoelectric generator (e.g., location of the thermoelectric generator, number of thermoelectric generators, inclusion of another battery that is not electrically coupled to the thermoelectric generator, etc.) may apply to the third battery and the third thermoelectric generator, respectively.

As previously discussed, each battery may provide electrical power to the respective electrical device(s) at least while electrical power from the remote electrical supply system to the electrical device(s) is interrupted. For example, in response to interruption of the electrical power from the surface electrical supply system or the subsea power unit, an operator or an automated system may initiate shutdown operations. The shutdown operations may include closing multiple valves via multiple electric valve actuators (e.g., electrical devices). The respective battery/batteries at the respective subsea component(s) may provide electrical power to the electric valve actuator(s) while electrical power from the remote electrical supply system to the electric valve actuator(s) is interrupted, thereby facilitating shutdown operations. For example, in certain embodiments, the remote electrical supply system may include a central/main battery or group of batteries. In such embodiments, the central/main battery/group of batteries may provide electrical power to the electric valve actuator(s) while electrical power from the surface electrical supply system or the subsea power unit is interrupted. In addition, the respective battery/batteries at the respective subsea component(s) may provide electrical power to the electric valve actuator(s) while electrical power from the central/main battery/group of batteries to the electric valve actuator(s) is interrupted. Because certain batteries at the subsea components are charged by the thermoelectric generators, each battery may be considered a second backup power source (e.g., in addition to the central/main battery/group of batteries of the remote electrical supply system, which may be considered a first backup power source), thereby satisfying customer and/or regulatory standards. Furthermore, because the thermoelectric generator(s) continuously recharge the battery/batteries while fluid is flowing through the resource extraction system, the battery/batteries may supply power to the electrical device(s) for a greater duration than battery/batteries that are not recharged by thermoelectric generator(s) (e.g., while the electrical power from the remote electrical supply system to the electrical device(s) is interrupted).

Figure 3:
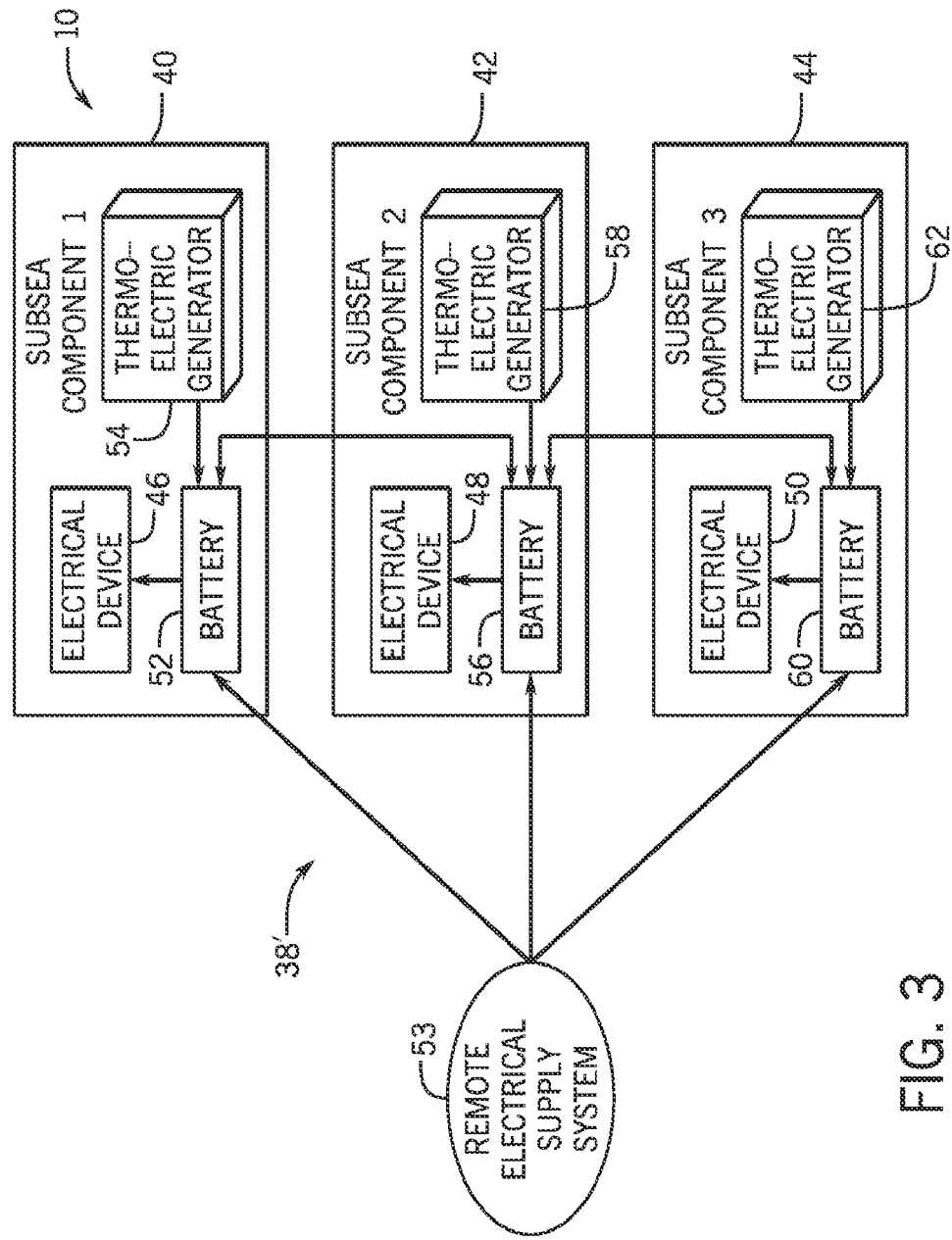
FIG. 3 is a block diagram of another embodiment of an electrical power system that may be employed within the resource extraction system of FIG. 1.

FIG. 3 is a block diagram of another embodiment of an electrical power system 38' that may be employed within the resource extraction system 10 of FIG. 1. In the illustrated embodiment, the first, second, and third batteries are electrically coupled to one another, as compared to the embodiment of the electrical power system of FIG. 2, in which the batteries are electrically independent from one another. The electrical connection between the batteries enables electrical power to be shared among the batteries. For example, if one thermoelectric generator is providing less electrical power to the respective battery, the battery may receive additional electrical power from another battery (e.g., which is receiving more electrical power from the respective thermoelectric generator). Accordingly, each battery may have sufficient capacity to provide the respective electrical device with electrical power (e.g., sufficient electrical power for shutdown operations) in response to interruption of the electrical power from the remote electrical supply system to the respective electrical devices.

In the illustrated embodiment, the first battery 52 is electrically coupled to the second battery 56, and the second battery 56 is electrically coupled to the third battery 60. However, in other embodiments, the batteries may be electrically coupled to one another by any other suitable arrangement of electrical connections. In addition, while each battery is electrically coupled to another battery in the illustrated embodiment, in other embodiments, at least one battery may be electrically independent of the other batteries. For example, in certain embodiments, the first battery may be electrically coupled to the second battery, and the third battery may not be electrically coupled to another battery. Each of the features, details, and variations disclosed above with regard to the embodiment of FIG. 2 may apply to the illustrated embodiment. For example, in certain embodiments, the electrical power system may include another battery positioned at a respective subsea component, in which the other battery is electrically coupled to the respective electrical device and to the remote electrical supply system, and in certain embodiments, the other battery is not electrically coupled to the respective thermoelectric generator.

Figure 4:
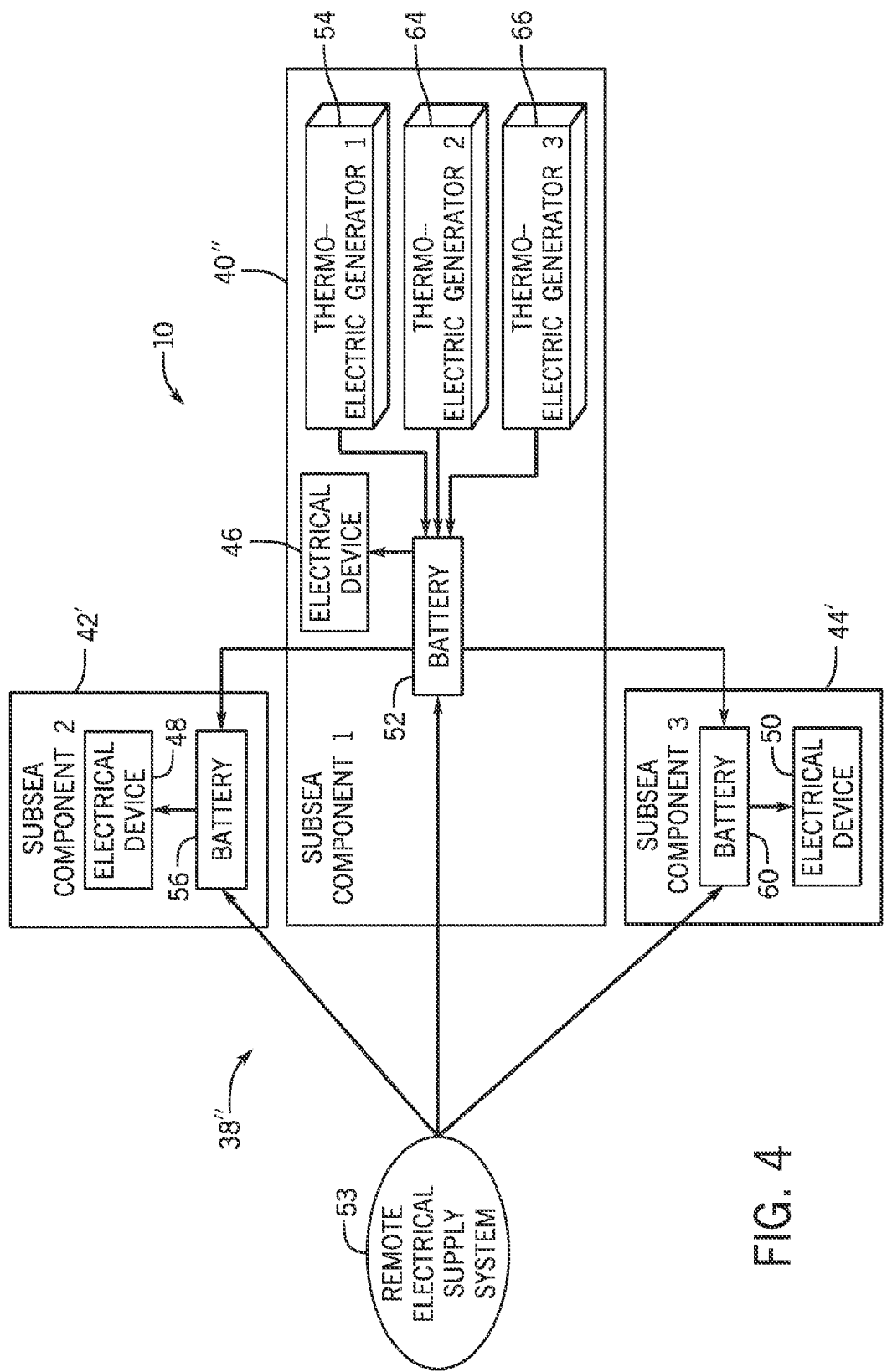
FIG. 4 is a block diagram of a further embodiment of an electrical power system that may be employed within the resource extraction system of FIG. 1.

FIG. 4 is a block diagram of a further embodiment of an electrical power system 38" that may be employed within the resource extraction system 10 of FIG. 1. In the illustrated embodiment, the electrical power system 38" includes three thermoelectric generators coupled to the first subsea component 40", as compared to the illustrated embodiments of the electrical power systems of FIGS. 2-3, in which a single thermoelectric generator is coupled to the first subsea component. As illustrated, the first thermoelectric generator 54 is electrically coupled to the first battery 52, a second thermoelectric generator 64 is electrically coupled to the first battery 52, and a third thermoelectric generator 66 is electrically coupled to the first battery 52. As previously discussed, each thermoelectric generator is configured to generate electrical power in response to a temperature difference between the fluid within the subsea component and the water surrounding the subsea component and to provide the electrical power to the battery. Each thermoelectric generator may be coupled to any suitable portion of the first subsea component, such as the main structure of the first subsea component, a conduit configured to provide fluid to the main structure, or a conduit configured to receive fluid from the main structure. For example, in certain embodiments, the first thermoelectric generator 54 may be coupled to the main structure, the second thermoelectric generator 64 may be coupled to a fluid outlet conduit, and the third thermoelectric generator 66 may be coupled to a fluid inlet conduit. While three thermoelectric generators are coupled to the first subsea component 40" in the illustrated embodiment, in other embodiments, more or fewer thermoelectric generators (e.g., 1, 2, 4, 5, 6, or more) may be coupled to the first subsea component.

Furthermore, in the illustrated embodiment, no thermoelectric generator is coupled to the second subsea component 42', and no thermoelectric generator is coupled to the third subsea component 44', as compared to the illustrated embodiments of the electrical power systems of FIGS. 2-3, in which a single thermoelectric generator is coupled to each of the second and third subsea components. In the illustrated embodiment, the first, second, and third batteries are electrically coupled to one another. The electrical connection between the batteries enables electrical power to flow from the first battery 52 to the second battery 56 and the third battery 60. Accordingly, each battery may have sufficient capacity to provide the respective electrical device with electrical power (e.g., sufficient electrical power for shutdown operations) in response to interruption of the electrical power from the remote electrical supply system to the respective electrical devices.

In the illustrated embodiment, the second battery 56 is electrically coupled to the first battery 52 and configured to receive electrical power from the first battery 52, and the third battery is electrically coupled to the first battery 52 and configured to receive electrical power from the first battery 52. However, in other embodiments, the batteries may be electrically coupled to one another by any other suitable arrangement of electrical connections. For example, in certain embodiments, the second battery may be electrically coupled to the first battery and configured to receive electrical power from the first battery, and the third battery may be electrically coupled to the second battery and configured to receive electrical power from the second battery. Accordingly, the third battery may receive electrical power indirectly from the first battery. Furthermore, while two batteries are electrically coupled to the first battery in the illustrated embodiment, in other embodiments, more or fewer batteries (e.g., positioned at subsea component(s) without thermoelectric generator(s)) may be electrically coupled to the first battery. In addition, in embodiments in which multiple batteries are positioned at the first subsea component, one or more of the batteries positioned at the first subsea component may be electrically coupled to one or more batteries positioned at other subsea component(s). Each of the features, details, and variations disclosed above with regard to the embodiment of FIG. 2 (e.g., except with regard to the thermoelectric generators coupled to the second and third subsea components) may apply to the illustrated embodiment. For example, in certain embodiments, the electrical power system may include another battery positioned at the first subsea component, in which the other battery is electrically coupled to the first electrical device and to the remote electrical supply system, and in certain embodiments, the other battery is not electrically coupled to the respective thermoelectric generators.

With regard to the embodiments of FIG. 2-4, a module including thermoelectric generator(s) and respective battery/batteries associated with at least one subsea component may be retrievable from the water, thereby facilitating replacement of the thermoelectric generator(s) and the respective battery/batteries. For example, in certain embodiments, the thermoelectric generator(s) and the respective battery/batteries associated with at least one subsea component may be disposed within a common housing. The common housing may be coupled to the subsea component (e.g., via a releasable connector), thereby facilitating retrieval and replacement of the module. Furthermore, with regard to the embodiments of FIGS. 2-4, in certain embodiments, the subsea components may be distributed across multiple wells. For example, one subsea component disclosed above with reference to FIGS. 2-4 may be positioned at a first well, and another subsea component disclosed above—with reference to FIGS. 2-4 may be positioned at a second well. In certain embodiments, the batteries positioned at the subsea components may be electrically coupled to one another. Accordingly, the battery positioned at the subsea component of the first well may provide electrical power to the battery of the subsea component positioned at the second well (e.g., while fluid is flowing through the first well, thereby enabling the thermoelectric generator coupled to the subsea component of the first well to provide electrical power to the respective battery, and no fluid is flowing through the second well).

Figure 5:
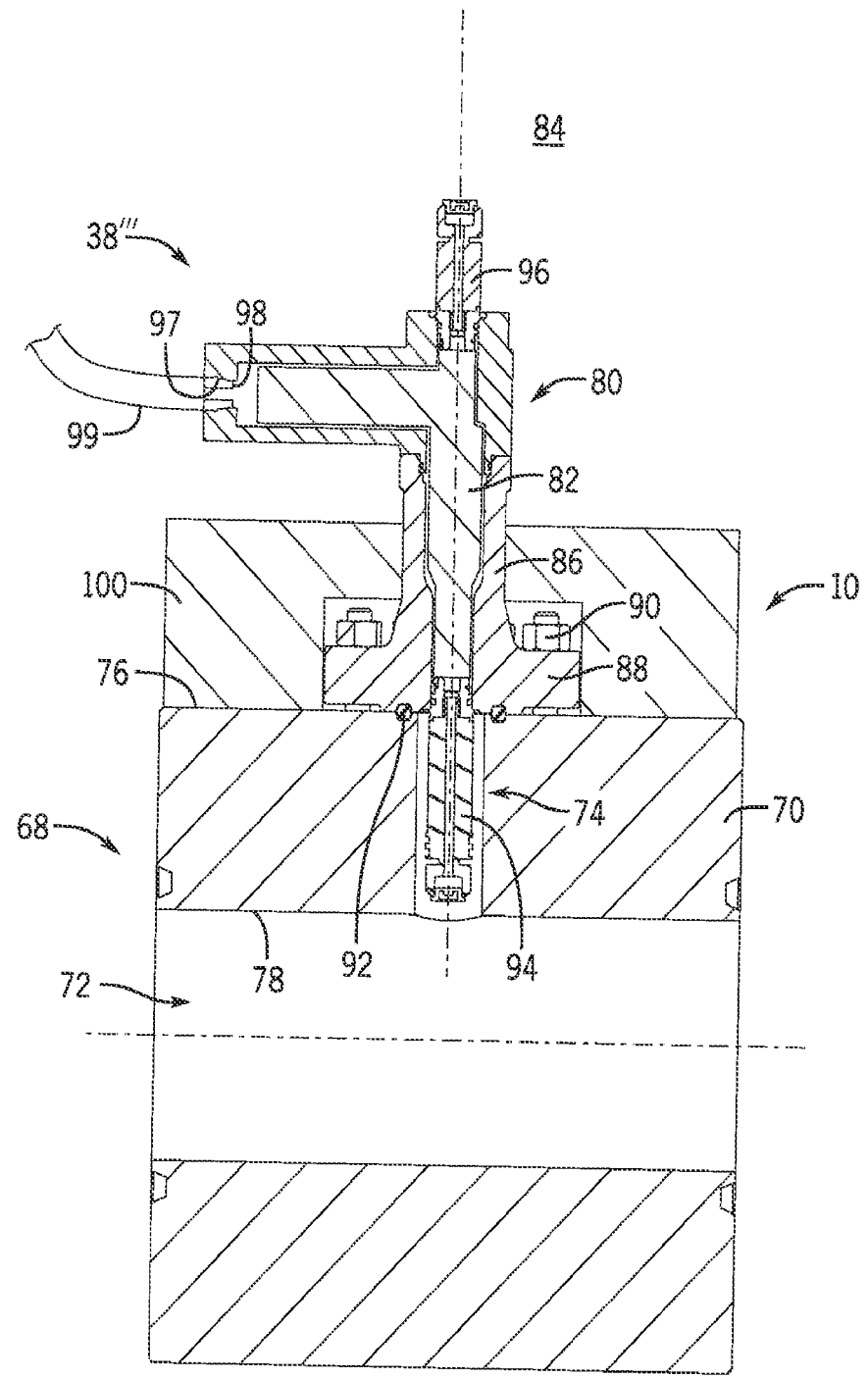
FIG. 5 is a cross-sectional view of an embodiment of an electrical power system that may be employed within the resource extraction system of FIG. 1.

FIG. 5 is a cross-sectional view of an embodiment of an electrical power system 38''' that may be employed within the resource extraction system 10 of FIG. 1. In the illustrated embodiment, the resource extraction system 10 includes a fluid containment structure 68. The fluid containment structure may correspond to any one of the subsea components disclosed above with reference to FIGS. 2-4, and/or any one of the subsea components disclosed above with reference to FIG. 1 (e.g., the BOP, the tree, the pipeline end manifold, a valve, etc.). In addition, the fluid containment structure may correspond to a portion of a subsea component (e.g., the main structure of the subsea component, a fluid inlet conduit of the subsea component, a fluid outlet conduit of the subsea component, etc.). Furthermore, the fluid containment structure may correspond to another suitable fluid containment structure, such as a flowline, a jumper, a conduit, a pipe, or another suitable fluid containment structure. In the illustrated embodiment, the fluid containment structure 68 has a wall 70 and a cavity 72 formed at least in part by the wall 70, and the cavity 72 is configured to house a fluid (e.g., hydrocarbon fluid, such as oil and/or natural gas). For example, with regard to flow passages (e.g., flowline, jumper, conduit, pipe, etc.), the wall may correspond to the structure of the flow passage, and the cavity may correspond to the flow path through the structure. Furthermore, with regard to other elements (e.g., BOP, tree, valve, etc.), the wall may correspond to an outer casing, and the cavity may correspond to an interior of the element. As illustrated, an opening 74 extends through the wall 70 to the cavity 72 (e.g., from an outer surface 76 of the wall 70 to an inner surface 78 of the wall 70).

Furthermore, in the illustrated embodiment, the electrical power system 38''' includes a thermoelectric generator assembly 80 coupled to the wall 70 and configured to block flow of the fluid from the opening 74 to an environment. The thermoelectric generator assembly 80 includes a thermoelectric generator 82, such as the thermoelectric generator disclosed above with regard to FIGS. 2-4. The thermoelectric generator 82 is configured to be in thermal communication with the fluid within the opening 74 and with the environment 84 external to the fluid containment structure 68. With regard to the subsea equipment disclosed herein, the environment may correspond to water, as disclosed above. However, in other embodiments, the environment may correspond to air or another suitable fluid (e.g., a cooling fluid surrounding the fluid containment structure, etc.). The thermoelectric generator 82 is configured to generate electrical power in response to a temperature differential between the fluid and the environment 84.

In the illustrated embodiment, the thermoelectric generator assembly 80 includes a housing 86 configured to couple to the wall 70 of the fluid containment structure 68. In addition, the thermoelectric generator 82 is disposed within the housing 86. In the illustrated embodiment, the housing 86 includes a flange 88 configured to engage the outer surface 76 of the wall 70 of the fluid containment structure 68 and to couple to the wall 70 via multiple fasteners 90. In addition, a seal 92 (e.g., annular o-ring, etc.) is disposed between the housing 86 and the wall 70. The fasteners 90 may apply a force to the housing 86 and the wall 70 sufficient to compress the seal 92, thereby substantially blocking flow of the fluid through the interface between the housing 86 and the wall 70. While a single seal is disposed between the housing and the wall in the illustrated embodiment, in other embodiments, more or fewer seals (e.g., 0, 2, 3, 4, or more) may be disposed between the housing and the wall to substantially block flow of the fluid through the interface. For example, in certain embodiments, the seal may be omitted. Furthermore, while the housing 86 is coupled to the wall 70 via a flanged connection in the illustrated embodiment, in other embodiments, the housing may be coupled to the wall by any other suitable type(s) of connection(s) (e.g., alone or in combination with the flanged connection). For example, the housing may be coupled to the wall by a threaded connection (e.g., the housing may have external threads configured to engage internal threads of the opening, etc.), a welded connection, an adhesive connection, a pinned connection, other suitable type(s) of connection(s), or a combination thereof. In addition, while the housing 86 of the thermoelectric generator assembly 80 is coupled to the wall 70 in the illustrated embodiment, in other embodiments, the thermoelectric generator or another suitable component of the thermoelectric generator assembly may be coupled to the wall. For example, in certain embodiments, the housing may be omitted.

In the illustrated embodiment, the thermoelectric generator assembly includes a fluid temperature sensor probe 94 configured to be disposed within the opening 74. The fluid temperature sensor probe 94 is configured to output a sensor signal indicative of a temperature of the fluid within the opening 74. For example, the fluid temperature sensor probe 94 may be communicatively coupled to a controller, and the controller may be configured to determine the temperature of the fluid based on the sensor signal from the fluid temperature sensor probe 94. In addition, the fluid temperature sensor probe 94 is in thermal communication with the thermoelectric generator 82, thereby establishing thermal communication between the thermoelectric generator 82 and the fluid within the opening 74. In the illustrated embodiment, the fluid temperature sensor probe 94 is in contact with the thermoelectric generator 82. However, in other embodiments, the fluid temperature sensor probe may be in thermal communication with the thermoelectric generator via an intervening thermally conductive element (e.g., cable, rod, bar, etc.). Because the fluid temperature sensor probe 94 extends into the opening 74, the contact area between the fluid temperature sensor probe and the fluid may be increased (e.g., as compared to a fluid temperature sensor probe that does not extend into the opening). Accordingly, a substantial amount of heat from the fluid may be transferred to the thermoelectric generator 82. While the thermoelectric generator assembly includes a fluid temperature sensor probe in the illustrated embodiment, in other embodiments, the fluid temperature sensor probe may be omitted. In such embodiments, another portion of the thermoelectric generator assembly may be configured to be disposed within the opening. For example, a portion of the thermoelectric generator may be configured to be disposed within the opening, or a heat transfer element (e.g., metal bar, etc.) in thermal communication with the thermoelectric generator may be configured to be disposed within the opening. The portion of the thermoelectric generator assembly configured to be disposed within the opening (e.g., the fluid temperature sensor probe, etc.) may be configured to extend partially through the opening or entirely through the opening to the cavity. Furthermore, in certain embodiments, no element of the thermoelectric generator assembly may extend into the opening (e.g., the fluid within the opening may contact an element of the thermoelectric generator assembly positioned at the interface between the thermoelectric generator assembly and the fluid containment structure, or the fluid within the opening may contact an element within the housing of the thermoelectric generator assembly).

In the illustrated embodiment, the thermoelectric generator assembly includes an environment temperature sensor probe 96 configured to be in thermal communication with the environment 84. The environment temperature sensor probe 96 is configured to output a sensor signal indicative of a temperature of the environment. For example, the environment temperature sensor probe 96 may be communicatively coupled to a controller, and the controller may be configured to determine the temperature of the environment based on the sensor signal from the environment temperature sensor probe 96. In addition, the environment temperature sensor probe 96 is in thermal communication with the thermoelectric generator 82, thereby establishing thermal communication between the thermoelectric generator 82 and the environment 84. In the illustrated embodiment, the environment temperature sensor probe 96 is in contact with the thermoelectric generator 82. However, in other embodiments, the environment temperature sensor probe may be in thermal communication with the thermoelectric generator via an intervening thermally conductive element (e.g., cable, rod, bar, etc.). In the illustrated embodiment, the environment temperature sensor probe 96 extends into the environment 84. Accordingly, the contact area between the environment temperature sensor probe and the environment may be increased (e.g., as compared to an environment temperature sensor probe that does not extend beyond the housing). As a result, a substantial amount of heat from the thermoelectric generator 82 may be transferred to the environment 84. While the thermoelectric generator includes an environment temperature sensor probe in the illustrated embodiment, in other embodiments, the environment temperature sensor probe may be omitted. In such embodiments, a portion of the thermoelectric generator may be configured to extend into the environment, or a heat transfer element (e.g., metal bar, etc.) in thermal communication with the thermoelectric generator may be configured to extend into the environment. Furthermore, in certain embodiments, no element of the thermoelectric generator assembly may extend into the environment (e.g., an element of the thermoelectric generator assembly positioned at the outer surface of the thermoelectric generator assembly or an element of the thermoelectric generator assembly positioned within the housing of the thermoelectric generator assembly may be in thermal communication with the environment).

In the illustrated embodiment, the fluid temperature sensor probe 94 is configured to establish a seal with the housing 86, thereby blocking flow of the fluid from the opening 74 into an interior of the housing 86. In embodiments in which the fluid temperature sensor probe is omitted, another suitable element (e.g., the thermoelectric generator, the heat transfer element, etc.) may establish the seal with the housing, or the housing may not include an aperture at the opening (e.g., a portion of the housing in thermal communication with the thermoelectric generator may be configured to be disposed within the opening, or the housing may extend across the opening at/proximate to the outer surface of the wall). In addition, in the illustrated embodiment, the environment temperature sensor probe 96 is configured to establish a seal with the housing 86, thereby blocking flow of the environment fluid (e.g., water) into an interior of the housing 86. In embodiments in which the environment temperature sensor probe is omitted, another suitable element (e.g., the thermoelectric generator, the heat transfer element, etc.) may establish the seal with the housing, or the housing may not include an aperture for an element extending into the environment (e.g., the housing may have a protrusion extending into the environment and in thermal communication with the thermal electric generator).

In the illustrated embodiment, the housing 86 of the thermoelectric generator assembly includes an outlet port 97. The outlet port 97 is configured to couple a connector 98 of a line/conduit 99 to the housing 86. The line/conduit 99 may include one or more conductors configured to facilitate transfer of the electrical power generated by the thermoelectric generator 82 (e.g., to respective battery/batteries). In addition, the line/conduit 99 may include one or more conductors configured to convey the sensor signal(s) from the fluid temperature sensor probe and/or the environment temperature sensor probe to a controller. In certain embodiments, the housing 86 is substantially sealed to block ingress of fluid from the fluid containment structure and fluid from the environment (e.g., water, etc.). In such embodiments, the outlet port 97 is configured to establish a seal with the respective connector 98 to block ingress of environment fluid into the thermoelectric generator assembly housing.

In the illustrated embodiment, the resource extraction system 10 includes thermal insulation 100 disposed between the wall 70 of the fluid containment structure 68 and the environment 84. The thermal insulation 100 is configured to reduce heat flux between the fluid within the fluid containment structure 68 and the environment 84 (e.g., water, etc.), thereby substantially maintaining the temperature of the fluid. As a result, in embodiments in which the fluid includes a hydrocarbon fluid, hydrate formation within the hydrocarbon fluid may be substantially reduced. In the illustrated embodiment, the thermoelectric generator assembly 80 extends through the thermal insulation 100, thereby enabling the thermoelectric generator 82 to be in thermal communication with the fluid within the opening 74 and with the environment 84. Due to the small cross-sectional area of the thermoelectric generator assembly 80, the cross-sectional area of the thermal insulation opening may be small, thereby substantially reducing heat flux from the fluid to the environment. In addition, because the thermoelectric generator assembly 80 extends through the insulation, the temperature differential across the thermoelectric generator may be significantly greater than the temperature differential across a thermoelectric generator positioned between the insulation and the environment or between the insulation and the fluid containment structure, thereby substantially increasing electrical power output by the thermoelectric generator. While the resource extraction system includes thermal insulation 100 on the fluid containment structure 68 in the illustrated embodiment, in other embodiments, the thermal insulation may be omitted.

In certain embodiments, the thermoelectric generator assembly 80 may be retrievable from the water, thereby facilitating replacement of the thermoelectric generator assembly. In addition, the thermoelectric generator assembly 80 disclosed herein may be employed within any or all the electrical power systems disclosed above with reference to FIGS. 2-4. However, in certain embodiments, at least one of the electrical power systems disclosed above with reference to FIGS. 2-4 may include another suitable type of thermoelectric generator arrangement. For example, in certain embodiments, an electrical power system may include a thermoelectric generator coupled to a portion of a wall of a subsea component that does not include an opening extending through the wall. Furthermore, while the thermoelectric generators are configured to provide electrical power to batteries in certain embodiments disclosed herein, in other embodiments, at least one thermoelectric generator may provide electrical power directly to one or more electrical devices (e.g., valve actuator(s), locking mechanism actuator (s), sensor(s), controller(s), etc.).

While only certain features have been illustrated and described herein, many modifications and changes will occur to those skilled in the art. It is, therefore, to be understood that the appended claims are intended to cover all such modifications and changes as fall within the true spirit of the disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. § 112(f). However, for any claims containing elements designated in any other manner, it is intended that such elements are not to be interpreted under 35 U.S.C. § 112(f).

What is claimed is:

1. An electrical power system for a resource extraction system, the electrical power system comprising:
a first battery configured to be positioned at a first subsea component of the resource extraction system, wherein the first subsea component is configured to be disposed within water and to house a first fluid, the first battery is configured to be electrically coupled to a first electrical device of the first subsea component, and the first battery is configured to provide electrical power to the first electrical device at least while electrical power from a remote electrical supply system to the first electrical device is interrupted;
a first thermoelectric generator configured to couple to the first subsea component, wherein the first thermoelectric generator is electrically coupled to the first battery, and the first thermoelectric generator is configured to generate electrical power in response to a temperature differential between the first fluid within the first subsea component and the water and to provide electrical power to the first battery;
a second battery configured to be positioned at a second subsea component of the resource extraction system, wherein the second subsea component is configured to be disposed within the water and to house a second fluid, the second battery is configured to be electrically coupled to a second electrical device of the second subsea component, and the second battery is configured to provide electrical power to the second electrical device at least while electrical power from the remote electrical supply system to the second electrical device is interrupted; and
a second thermoelectric generator configured to couple to the second subsea component, wherein the second thermoelectric generator is electrically coupled to the second battery, and the second thermoelectric generator is configured to generate electrical power in response to a temperature differential between the second fluid within the second subsea component and the water and to provide electrical power to the second battery.

2. A resource extraction system comprising:
a first subsea component having a wall and a cavity formed at least in part by the wall, wherein the cavity is configured to house a fluid, and an opening extends through the wall to the cavity; and
the electrical power system of claim 1 comprising a thermoelectric generator assembly configured to couple to the wall, wherein a portion of the thermoelectric generator assembly is configured to be disposed within the opening, the thermoelectric generator assembly comprises the first thermoelectric generator, the first thermoelectric generator is configured to be in thermal communication with the fluid within the opening and with an environment external to the first subsea component, and the first thermoelectric generator is configured to generate electrical power in response to a temperature differential between the fluid within the opening and the environment.

3. The resource extraction system of claim 2, wherein the thermoelectric generator assembly comprises a fluid temperature sensor probe, the fluid temperature sensor probe forms the portion of the thermoelectric generator assembly configured to be disposed within the opening, the fluid temperature sensor probe is configured to output a signal indicative of a temperature of the fluid within the opening, and the fluid temperature sensor probe is in thermal communication with the first thermoelectric generator.

4. The resource extraction system of claim 2, wherein the thermoelectric generator assembly comprises an environment temperature sensor probe configured to be in thermal communication with the environment, the environment temperature sensor probe is configured to output a signal indicative of a temperature of the environment, and the environment temperature sensor probe is in thermal communication with the first thermoelectric generator.

5. The resource extraction system of claim 2, wherein the first subsea component comprises a pipe.

6. The resource extraction system of claim 2, comprising thermal insulation disposed between the wall of the first subsea component and the environment, wherein the thermoelectric generator assembly extends through the thermal insulation.

7. The electrical power system of claim 1, wherein the first battery is electrically coupled to the second battery and configured to receive electrical power from the second battery, and wherein the second battery is configured to receive electrical power from the first battery.

8. The electrical power system of claim 1, comprising a third thermoelectric generator configured to couple to the first subsea component, wherein the third thermoelectric generator is electrically coupled to the first battery, and the third thermoelectric generator is configured to generate electrical power in response to the temperature differential between the first fluid within the first subsea component and the water and to provide electrical power to the first battery.

9. The electrical power system of claim 1, comprising a thermoelectric generator assembly configured to couple to a wall of the first subsea component, wherein a portion of the thermoelectric generator assembly is configured to be disposed within an opening in the wall that extends through the wall to a cavity within the first subsea component, the thermoelectric generator assembly comprises the first thermoelectric generator, and the first thermoelectric generator is configured to be in thermal communication with the first fluid within the opening and with the water.

10. The electrical power system of claim 9, wherein the thermoelectric generator assembly comprises a housing configured to couple to the wall of the first subsea component, and the first thermoelectric generator is disposed within the housing.

11. The electrical power system of claim 10, wherein the housing comprises a flange configured to engage an outer surface of the wall of the first subsea component and to couple to the wall via a plurality of fasteners.

12. The electrical power system of claim 9, wherein the thermoelectric generator assembly comprises a fluid temperature sensor probe, the fluid temperature sensor probe forms the portion of the thermoelectric generator assembly configured to be disposed within the opening, the fluid temperature sensor probe is configured to output a signal indicative of a temperature of the fluid within the opening, and the fluid temperature sensor probe is in thermal communication with the first thermoelectric generator.

13. The electrical power system of claim 9, wherein the thermoelectric generator assembly comprises an environment temperature sensor probe configured to be in thermal communication with the environment, the environment temperature sensor probe is configured to output a signal indicative of a temperature of the environment, and the environment temperature sensor probe is in thermal communication with the first thermoelectric generator.

14. An electrical power system for a resource extraction system, the electrical power system comprising:
a first battery configured to be positioned at a first subsea component of the resource extraction system, wherein the first subsea component is configured to be disposed within water and to house a first fluid, the first battery is configured to be electrically coupled to a first electrical device of the first subsea component, and the first battery is configured to provide electrical power to the first electrical device at least while electrical power from a remote electrical supply system to the first electrical device is interrupted;
a first thermoelectric generator configured to couple to the first subsea component, wherein the first thermoelectric generator is electrically coupled to the first battery, and the first thermoelectric generator is configured to generate electrical power in response to a temperature differential between the first fluid within the first subsea component and the water and to provide electrical power to the first battery; and
a second battery configured to be positioned at a second subsea component of the resource extraction system, wherein the second subsea component is configured to be disposed within the water and to house a second fluid, the second battery is configured to be electrically coupled to a second electrical device of the second subsea component, the second battery is electrically coupled to the first battery and configured to receive electrical power from the first battery, and the second battery is configured to provide electrical power to the second electrical device at least while electrical power from the remote electrical supply system to the second electrical device is interrupted.

15. The electrical power system of claim 14, comprising a second thermoelectric generator configured to couple to the first subsea component, wherein the second thermoelectric generator is electrically coupled to the first battery, and the second thermoelectric generator is configured to generate electrical power in response to the temperature differential between the first fluid within the first subsea component and the water and to provide electrical power to the first battery.

16. The electrical power system of claim 14, comprising a thermoelectric generator assembly configured to couple to a wall of the first subsea component, wherein a portion of the thermoelectric generator assembly is configured to be disposed within an opening in the wall that extends through the wall to a cavity within the first subsea component, the thermoelectric generator assembly comprises the first thermoelectric generator, and the first thermoelectric generator is configured to be in thermal communication with the first fluid within the opening and with the water.

17. The electrical power system of claim 16, wherein the thermoelectric generator assembly comprises a housing configured to couple to the wall of the first subsea component, and the first thermoelectric generator is disposed within the housing.

18. The electrical power system of claim 17, wherein the housing comprises a flange configured to engage an outer surface of the wall of the first subsea component and to couple to the wall via a plurality of fasteners.

19. The electrical power system of claim 16, wherein the thermoelectric generator assembly comprises a fluid temperature sensor probe, the fluid temperature sensor probe forms the portion of the thermoelectric generator assembly configured to be disposed within the opening, the fluid temperature sensor probe is configured to output a signal indicative of a temperature of the fluid within the opening, and the fluid temperature sensor probe is in thermal communication with the first thermoelectric generator.

20. The electrical power system of claim 16, wherein the thermoelectric generator assembly comprises an environment temperature sensor probe configured to be in thermal communication with the environment, the environment temperature sensor probe is configured to output a signal indicative of a temperature of the environment, and the environment temperature sensor probe is in thermal communication with the first thermoelectric generator.

* * * * *